(12) United States Patent
Isaacs et al.

(10) Patent No.: US 9,560,737 B2
(45) Date of Patent: Jan. 31, 2017

(54) ELECTRONIC PACKAGE WITH HEAT TRANSFER ELEMENT(S)

(71) Applicant: INTERNATIONAL BUSINESS MACHINES CORPORATION, Armonk, NY (US)

(72) Inventors: Phillip D. Isaacs, Rochester, MN (US); Michael T. Peets, Staatsburg, NY (US); Xiaojin Wei, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/637,501

(22) Filed: Mar. 4, 2015

(65) Prior Publication Data

US 2016/0262253 A1    Sep. 8, 2016

(51) Int. Cl.
*H05K 7/20*    (2006.01)
*H05K 1/02*    (2006.01)
(Continued)

(52) U.S. Cl.
CPC .............. *H05K 1/0203* (2013.01); *H05K 5/03* (2013.01); *H05K 5/065* (2013.01); *H05K 7/1427* (2013.01); *H05K 13/0023* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
(Continued)

(56) References Cited

U.S. PATENT DOCUMENTS 3,165,569 A    1/1965    Bright et al.
4,160,503 A    7/1979    Ohlbach
(Continued)

FOREIGN PATENT DOCUMENTS

CN    201430639 Y    3/2010
CN    104346587 A    2/2015
(Continued)

OTHER PUBLICATIONS

Simek, Bob, "Tamper Restrictive Thermal Ventilation System for Enclosures Requiring Ventilation and Physical Security", IBM Publication No. IPCOM000008607D, Mar. 1, 1998 (2 pages).
(Continued)

*Primary Examiner* — Anthony Haughton
*Assistant Examiner* — Razmeen Gafur
(74) *Attorney, Agent, or Firm* — Margaret A. McNamara, Esq.; Kevin P. Radigan, Esq.; Heslin Rothenberg Farley & Mesiti P.C.

(57) ABSTRACT

Electronic packages are provided with enhanced heat dissipation capabilities. The electronic package includes a plurality of electronic components, and an enclosure in which the electronic components reside. The enclosure includes a thermally conductive cover overlying the electronic components. At least one heat transfer element is coupled to, or integrated with, the thermally conductive cover and resides between a main surface of the cover and at least one respective electronic component of the plurality of electronic components. A thermal interface material is disposed between the heat transfer element(s) and the respective electronic component(s), and facilitates conductive transfer of heat from the electronic component(s) to the thermally conductive cover through the heat transfer element(s). The thermally conductive cover facilitates spreading and dissipating of the transferred heat outwards, for instance, through (Continued)

a surrounding tamper-respondent sensor and/or a surrounding encapsulant.

18 Claims, 6 Drawing Sheets

(51) Int. Cl.
   *H05K 5/06* (2006.01)
   *H05K 5/03* (2006.01)
   *H05K 7/14* (2006.01)
   *H05K 13/00* (2006.01)
   *H01L 23/473* (2006.01)

(58) Field of Classification Search
   USPC ...... 361/676–678, 679.46–679.54, 688–723;
   165/80.1–80.5, 104.33, 185;
   174/15.1–15.3, 16.1–16.3, 547, 548;
   257/712–722, E23.088; 24/453, 458–459;
   454/184; 312/236
   See application file for complete search history.

(56) References Cited

U.S. PATENT DOCUMENTS

| | | | |
|---|---|---|---|
| 4,211,324 A | 7/1980 | Ohlbach | |
| 4,324,823 A | 4/1982 | Ray, III | |
| 4,496,900 A | 1/1985 | Di Stefano et al. | |
| 4,516,679 A | 5/1985 | Simpson | |
| 4,593,384 A | 6/1986 | Kleijne | |
| 4,609,104 A | 9/1986 | Kasper et al. | |
| 4,653,252 A | 3/1987 | van de Haar et al. | |
| 4,677,809 A | 7/1987 | Long et al. | |
| 4,691,350 A | 9/1987 | Kleijne et al. | |
| 4,807,284 A | 2/1989 | Kleijne | |
| 4,811,288 A | 3/1989 | Kleijne et al. | |
| 4,860,351 A | 8/1989 | Weingart | |
| 4,865,197 A | 9/1989 | Craig | |
| 5,009,311 A | 4/1991 | Schenk | |
| 5,027,397 A | 6/1991 | Double et al. | |
| 5,060,114 A | 10/1991 | Feinberg et al. | |
| 5,075,822 A | 12/1991 | Baumler et al. | |
| 5,117,457 A | 5/1992 | Comerford et al. | |
| 5,185,717 A | 2/1993 | Mori | |
| 5,201,868 A | 4/1993 | Johnson | |
| 5,201,879 A | 4/1993 | Steele et al. | |
| 5,211,618 A | 5/1993 | Stoltz | |
| 5,239,664 A | 8/1993 | Verrier et al. | |
| 5,389,738 A | 2/1995 | Piosenka et al. | |
| 5,406,630 A | 4/1995 | Piosenka et al. | |
| 5,506,566 A | 4/1996 | Oldfield et al. | |
| 5,568,124 A | 10/1996 | Joyce et al. | |
| 5,594,439 A | 1/1997 | Swanson | |
| 5,675,319 A | 10/1997 | Rivenberg et al. | |
| 5,715,652 A | 2/1998 | Stahlecker | |
| 5,761,054 A | 6/1998 | Kuhn | |
| 5,813,113 A | 9/1998 | Stewart et al. | |
| 5,858,500 A | 1/1999 | MacPherson | |
| 5,880,523 A | 3/1999 | Candelore | |
| 5,988,510 A | 11/1999 | Tuttle et al. | |
| 6,121,544 A | 9/2000 | Petsinger | |
| 6,195,267 B1 | 2/2001 | MacDonald, Jr. et al. | |
| 6,201,296 B1 | 3/2001 | Fries et al. | |
| 6,261,215 B1 | 7/2001 | Imer | |
| 6,301,096 B1 | 10/2001 | Wozniczka | |
| 6,384,397 B1 | 5/2002 | Takiar et al. | |
| 6,424,954 B1 | 7/2002 | Leon | |
| 6,438,825 B1 | 8/2002 | Kuhn | |
| 6,469,625 B1 | 10/2002 | Tomooka | |
| 6,473,304 B1 | 10/2002 | Stevens | |
| 6,512,454 B2 | 1/2003 | Miglioli et al. | |
| 6,643,995 B1 | 11/2003 | Kayama | |
| 6,686,539 B2 | 2/2004 | Farquhar et al. | |
| 6,746,960 B2 | 6/2004 | Goodman | |
| 6,798,660 B2 | 9/2004 | Moss et al. | |
| 6,853,093 B2 | 2/2005 | Cohen et al. | |
| 6,879,032 B2 | 4/2005 | Rosenau et al. | |
| 6,929,900 B2 | 8/2005 | Farquhar et al. | |
| 6,946,960 B2 | 9/2005 | Sisson et al. | |
| 6,957,345 B2 | 10/2005 | Cesana et al. | |
| 6,970,360 B2 | 11/2005 | Sinha | |
| 6,985,362 B2 | 1/2006 | Mori et al. | |
| 6,991,961 B2 | 1/2006 | Hubbard et al. | |
| 6,996,953 B2 | 2/2006 | Perreault et al. | |
| 7,005,733 B2 | 2/2006 | Kommerling et al. | |
| 7,015,823 B1 | 3/2006 | Gillen et al. | |
| 7,054,162 B2 | 5/2006 | Benson et al. | |
| 7,057,896 B2 | 6/2006 | Matsuo et al. | |
| 7,094,143 B2 | 8/2006 | Wolm et al. | |
| 7,094,459 B2 | 8/2006 | Takahashi | |
| 7,095,615 B2 | 8/2006 | Nichols | |
| 7,156,233 B2 | 1/2007 | Clark et al. | |
| 7,180,008 B2 | 2/2007 | Heitmann et al. | |
| 7,189,360 B1 | 3/2007 | Ho | |
| 7,214,874 B2 | 5/2007 | Dangler et al. | |
| 7,247,791 B2 | 7/2007 | Kulpa | |
| 7,304,373 B2 | 12/2007 | Taggart et al. | |
| 7,310,737 B2 | 12/2007 | Patel et al. | |
| 7,465,887 B2 | 12/2008 | Suzuki et al. | |
| 7,475,474 B2 | 1/2009 | Heitmann et al. | |
| 7,515,418 B2 | 4/2009 | Straznicky et al. | |
| 7,549,064 B2 | 6/2009 | Elbert et al. | |
| 7,640,658 B1 | 1/2010 | Pham et al. | |
| 7,643,290 B1 | 1/2010 | Narasimhan et al. | |
| 7,663,883 B2 | 2/2010 | Shirakami et al. | |
| 7,672,129 B1 | 3/2010 | Ouyang et al. | |
| 7,731,517 B2 | 6/2010 | Lee et al. | |
| 7,746,657 B2 | 6/2010 | Oprea et al. | |
| 7,760,086 B2 | 7/2010 | Hunter et al. | |
| 7,768,005 B2 | 8/2010 | Condorelli et al. | |
| 7,783,994 B2 | 8/2010 | Ball et al. | |
| 7,787,256 B2 | 8/2010 | Chan et al. | |
| 7,868,441 B2 | 1/2011 | Eaton et al. | |
| 7,898,413 B2 | 3/2011 | Hsu et al. | |
| 7,901,977 B1 | 3/2011 | Angelopoulos et al. | |
| 7,947,911 B1 | 5/2011 | Pham et al. | |
| 7,978,070 B2 | 7/2011 | Hunter | |
| 8,084,855 B2 | 12/2011 | Lower et al. | |
| 8,094,450 B2 | 1/2012 | Cole | |
| 8,101,267 B2 | 1/2012 | Samuels et al. | |
| 8,133,621 B2 | 3/2012 | Wormald et al. | |
| 8,199,506 B2 | 6/2012 | Janik et al. | |
| 8,287,336 B2 | 10/2012 | Dangler et al. | |
| 8,325,486 B2 | 12/2012 | Arshad et al. | |
| 8,516,269 B1 | 8/2013 | Hamlet et al. | |
| 8,589,703 B2 | 11/2013 | Lee | |
| 8,646,108 B2 | 2/2014 | Shiakallis et al. | |
| 8,659,506 B2 | 2/2014 | Nomizo | |
| 8,659,908 B2 | 2/2014 | Adams et al. | |
| 8,664,047 B2 | 3/2014 | Lower et al. | |
| 8,716,606 B2 | 5/2014 | Kelley et al. | |
| 8,797,059 B2 | 8/2014 | Boday et al. | |
| 8,836,509 B2 | 9/2014 | Lowy | |
| 8,853,839 B2 | 10/2014 | Gao et al. | |
| 8,879,266 B2 | 11/2014 | Jarvis et al. | |
| 8,890,298 B2 | 11/2014 | Buer et al. | |
| 8,947,889 B2 | 2/2015 | Kelley et al. | |
| 8,961,280 B2 | 2/2015 | Dangler et al. | |
| 9,003,199 B2 | 4/2015 | Dellmo et al. | |
| 9,011,762 B2 | 4/2015 | Seppa et al. | |
| 9,052,070 B2 | 6/2015 | Davis et al. | |
| 2001/0050425 A1 | 12/2001 | Beroz et al. | |
| 2001/0056542 A1 | 12/2001 | Cesana et al. | |
| 2002/0002683 A1 | 1/2002 | Benson | |
| 2002/0068384 A1 | 6/2002 | Beroz et al. | |
| 2002/0084090 A1 | 7/2002 | Farquhar | |
| 2003/0009684 A1 | 1/2003 | Schwenck et al. | |
| 2003/0066637 A1 | 4/2003 | Zimman | |
| 2005/0068735 A1* | 3/2005 | Fissore | H01L 23/047 361/702 |
| 2005/0111194 A1* | 5/2005 | Sohn | H01L 23/3672 361/704 |

(56) References Cited

U.S. PATENT DOCUMENTS

| | | | |
|---|---|---|---|
| 2005/0180104 A1* | 8/2005 | Olesen | F28F 3/12 361/699 |
| 2006/0034731 A1 | 2/2006 | Lewis et al. | |
| 2006/0049941 A1* | 3/2006 | Hunter | G01R 22/066 340/545.6 |
| 2006/0072288 A1* | 4/2006 | Stewart | H02K 1/148 361/690 |
| 2006/0196945 A1 | 9/2006 | Mendels | |
| 2006/0218779 A1 | 10/2006 | Ooba et al. | |
| 2007/0064396 A1* | 3/2007 | Oman | H01L 23/427 361/700 |
| 2007/0064399 A1* | 3/2007 | Mandel | H01L 21/4878 361/719 |
| 2007/0108619 A1 | 5/2007 | Hsu | |
| 2007/0211436 A1* | 9/2007 | Robinson | H01L 23/552 361/719 |
| 2007/0230127 A1* | 10/2007 | Peugh | H01L 23/053 361/699 |
| 2007/0268671 A1* | 11/2007 | Brandenburg | H01L 23/3675 361/704 |
| 2008/0050512 A1 | 2/2008 | Lower et al. | |
| 2008/0106400 A1* | 5/2008 | Hunter | G06F 21/87 340/540 |
| 2008/0144290 A1* | 6/2008 | Brandt | B60R 16/0239 361/720 |
| 2008/0159539 A1 | 7/2008 | Huang et al. | |
| 2008/0160274 A1 | 7/2008 | Dang et al. | |
| 2008/0191174 A1 | 8/2008 | Ehrensvard et al. | |
| 2008/0251906 A1 | 10/2008 | Eaton et al. | |
| 2009/0073659 A1* | 3/2009 | Peng | H05K 7/209 361/709 |
| 2009/0166065 A1 | 7/2009 | Clayton et al. | |
| 2010/0088528 A1 | 4/2010 | Sion | |
| 2010/0110647 A1 | 5/2010 | Hiew et al. | |
| 2010/0177487 A1 | 7/2010 | Arshad et al. | |
| 2010/0319986 A1 | 12/2010 | Bleau et al. | |
| 2011/0001237 A1 | 1/2011 | Brun et al. | |
| 2011/0038123 A1 | 2/2011 | Janik et al. | |
| 2011/0090658 A1* | 4/2011 | Adams | H01L 23/573 361/765 |
| 2011/0103027 A1* | 5/2011 | Aoki | H01L 23/4093 361/752 |
| 2011/0241446 A1 | 10/2011 | Tucholski | |
| 2011/0299244 A1* | 12/2011 | Dede | F28F 3/046 361/689 |
| 2012/0050998 A1 | 3/2012 | Klum et al. | |
| 2012/0117666 A1 | 5/2012 | Oggioni et al. | |
| 2012/0140421 A1* | 6/2012 | Kirstine | H05K 7/20509 361/722 |
| 2012/0149150 A1 | 6/2012 | Toh et al. | |
| 2012/0170217 A1* | 7/2012 | Nishikimi | H05K 7/20927 361/689 |
| 2012/0185636 A1 | 7/2012 | Leon et al. | |
| 2012/0244742 A1* | 9/2012 | Wertz | H01L 23/4006 439/485 |
| 2012/0256305 A1 | 10/2012 | Kaufmann et al. | |
| 2012/0320529 A1* | 12/2012 | Loong | H01L 23/3735 361/702 |
| 2013/0033818 A1* | 2/2013 | Hosoda | H05K 7/20927 361/688 |
| 2013/0058052 A1* | 3/2013 | Arshad | G06F 21/86 361/737 |
| 2013/0141137 A1 | 6/2013 | Krutzik et al. | |
| 2013/0158936 A1 | 6/2013 | Rich et al. | |
| 2013/0208422 A1* | 8/2013 | Hughes | H05K 7/20445 361/700 |
| 2013/0235527 A1* | 9/2013 | Wagner | H05K 1/0203 361/702 |
| 2013/0283386 A1* | 10/2013 | Lee | G06F 21/86 726/26 |
| 2014/0022733 A1* | 1/2014 | Lim | H05K 7/2039 361/718 |
| 2014/0160679 A1* | 6/2014 | Kelty | H05K 7/20672 361/700 |
| 2014/0184263 A1 | 7/2014 | Ehrenpfordt et al. | |
| 2014/0204533 A1* | 7/2014 | Abeyasekera | H01L 23/3735 361/699 |
| 2014/0321064 A1* | 10/2014 | Bose | H01L 23/4093 361/720 |
| 2014/0325688 A1* | 10/2014 | Cashin | G06F 21/86 726/34 |
| 2015/0007427 A1 | 1/2015 | Dangler et al. | |
| 2015/0235053 A1 | 8/2015 | Lee et al. | |
| 2016/0005262 A1 | 1/2016 | Hirato et al. | |

FOREIGN PATENT DOCUMENTS

| | | |
|---|---|---|
| DE | 19816571 A1 | 10/1999 |
| DE | 19816572 A1 | 10/1999 |
| DE | 102012203955 A1 | 9/2013 |
| EP | 000566360 A1 | 10/1993 |
| EP | 0629497 A2 | 12/1994 |
| EP | 1184773 A1 | 3/2002 |
| EP | 1207444 A2 | 5/2002 |
| EP | 1 734 578 A1 | 12/2006 |
| EP | 1968362 A2 | 9/2008 |
| EP | 2104407 A1 | 9/2009 |
| EP | 1 672 484 B1 | 4/2012 |
| EP | 2560467 A1 | 2/2013 |
| JP | 61-297035 A | 12/1986 |
| JP | 2000-238141 A | 9/2000 |
| JP | 2013-125807 A | 6/2013 |
| JP | 2013-140112 A | 7/2013 |
| WO | WO9903675 A1 | 1/1999 |
| WO | WO99/21142 A1 | 4/1999 |
| WO | WO01/63994 A2 | 8/2001 |
| WO | WO03025080 A1 | 3/2003 |
| WO | WO2004040505 A1 | 5/2004 |
| WO | WO 2009/042335 A1 | 4/2009 |
| WO | WO2009/092472 A1 | 7/2009 |
| WO | WO2010/128939 A1 | 11/2010 |
| WO | WO2013/004292 A1 | 1/2013 |
| WO | WO 2013/189483 A1 | 12/2013 |
| WO | WO2014/086987 A2 | 6/2014 |
| WO | WO2014/158159 A1 | 10/2014 |

OTHER PUBLICATIONS

Saran et al., "Fabrication and Characterization of Thin Films of Single-Walled Carbon Nanotube Bundles on Flexible Plastic Substrates", Journal of the American Chemical Society, vol. 126, No. 14 (Mar. 23, 2004) (pp. 4462-4463).

Khanna P.K. et al., "Studies on Three-Dimensional Moulding, Bonding and Assembling of Low-Temperature-Cofired Ceramics MEMS and MST Applications." Materials Chemistry and Physics, vol. 89, No. 1 (2005) (pp. 72-79).

Loher et al., "Highly Integrated Flexible Electronic Circuits and Modules", 3rd International IEEE on Microsystems, Packaging, Assembly & Circuits Technology Conference (Oct. 22-24, 2008) (Abstract Only) (1 page).

Drimer et al., "Thinking Inside the Box: System-Level Failures of Tamper Proofing", 2008 IEEE Symposium on Security and Privacy, (Feb. 2008) (pp. 281-295).

Fisher et al., "Embedded Venting System", U.S. Appl. No. 14/797,232, filed Jul. 13, 2015 (35 pages).

Isaacs et al., "List of IBM Patents or Patent Applications Treated As Related" for U.S. Appl. No. 14/637,501, filed Mar. 4, 2015, dated Dec. 21, 2015 (2 pages).

Isaacs et al., "Electronic Package with Heat Transfer Element(s)", U.S. Appl. No. 14/846,897, filed Sep. 7, 2015 (27 pages).

Dangler et al., "Tamper-Respondent Sensors with Formed Flexible Layer(s)", U.S. Appl. No. 14/865,551, filed Sep. 25, 2015 (113 pages).

Brodsky et al., "Overlapping, Discrete Tamper-Respondent Sensors", U.S. Appl. No. 14/865,572, filed Sep. 25, 2015 (114 pages).

Danger et al., "Tamper-Respondent Assemblies with Region(s) of Increased Susceptibility to Damage", U.S Appl. No. 14/865,591, filed Sep. 25, 2015 (114 pages).

(56) References Cited

OTHER PUBLICATIONS

Brodsky et al., "Circuit Boards and Electronic Packages with Embedded Tamper-Respondent Sensor", U.S. Appl. No. 14/865,610, filed Sep. 25, 2015 (43 pages).
Brodsky et al, "Tamper-Respondent Assemblies", U.S. Appl. No. 14/865,632, filed Sep. 25, 2015 (115 pages).
Brodksky et al., "Enclosure with Inner Tamper-Respondent Sensor(s)", U.S. Appl. No. 14/865,651, filed Sep. 25, 2015 (115 pages).
Fisher et al., "Enclosure with Inner Tamper-Respondent Sensor(s) and Physical Security Element(s)", U.S. Appl. No. 14/865,686, filed Sep. 25, 2015 (114 pages).
Brodsky et al., "Tamper-Respondent Assemblies with Bond Protection", U.S. Appl. No. 14/865,708, filed Sep. 25, 2015 (113 pages).
Brodsky et al., "Circuit Layouts of Tamper-Respondent Sensors", U.S. Appl. No. 14/886,179, filed Oct. 19, 2015 (113 pages).
Isaacs, Phillip Duane, "Tamper-Respondent Assembly with Protective Wrap(s) Over Tamper-Respondent Sensor(s)", U.S. Appl. No. 14/918,691, filed Oct. 21, 2015 (40 pages).
Brodsky et al., "Tamper-Respondent Assemblies with Bond Protection", U.S. Appl. No. 14/941,860, filed Nov. 16, 2015 (108 pages).
Fisher et al., "Enclosure with Inner Tamper-Respondent Sensor(s) and Physical Security Element(s)", U.S. Appl. No. 14/941,872, filed Nov. 16, 2015 (109 pages).
Brodsky et al, "Tamper-Respondent Assemblies", U.S. Appl. No. 14/941,887, filed Nov. 16, 2015 (109 pages).
Brodsky et al., "Circuit Boards and Electronic Packages with Embedded Tamper-Respondent Sensors", U.S. Appl. No. 14/941,908, filed Nov. 16 2015 (41 pages).
Fisher et al., "Tamper-Respondent Assembly with Vent Structure", U.S. Appl. No. 14/955,283, filed Dec. 1, 2015 (61 pages).
Fisher et al., "Applying Pressure to Adhesive Using CTE Mismatch Between Components", U.S. Appl. No. 14/963,681, filed Dec. 9, 2015 (68 pages).
Eirodsky et al., "Tamper-Respondent Assemblies with Enclosure-to-Board Protection", U.S. Appl. No. 14/974,036, filed Dec. 18, 2015 (55 pages).
Anonymous, "Consolidated Non-Volatile Memory in a Chip Stack", IBM Technical Disclosure: IP.com No. IPCOM000185250, Jul. 16, 2009 (6 pages).
Anonymous, "Selective Memory Encryption", IBM Technical Disclosure: IP.com No. IPCOM000244183, Nov. 20, 2015 (6 pages).
Busby et al., "Multi-Layer Stack with Embedded Tamper-Detect Protection", U.S. Appl. No. 15/053,336, filed Feb. 25, 2016 (68 pages).
Isaacs et al., "List of IBM Patents and/or Patent Applications Treated as Related", U.S. Appl. No. 14/637,501, filed Mar. 4, 2015, dated Mar. 7, 2016 (2 pages).
Pamula et al., "Cooling of Integrated Circuits Using Droplet-Based Microfluidics", Association for Computing Machinery (ACM), GLSVLSI'03, Apr. 28-29, 2003 (pp. 84-87).
Sample et al., "Design of an RFID-Based Battery-Free Programmable Sensing Platform", IEEE Transactions on Instrumentation and Measurement, vol. 57, No. 11, Nov. 2008 (pp. 2608-2615).
Cabral, Jr. et al., "Controlling Fragmentation of Chemically Strengthened Glass", U.S. Appl. No. 14/700,877, filed Apr. 30, 2015 (48 pages).

Fisher et al., Office Action for U.S. Appl. No. 14/963,681, filed Dec. 9, 2015, dated May 6, 2016 (10 pages).
Campbell et al., "Tamper-Proof Electronic Packages With Two-Phase Dielectric Fluid", U.S. Appl. No. 15/139,503, filed Apr. 27, 2016 (60 pages).
Busby et al., "Tamper-Proof Electronic Packages Formed With Stressed Glass", U.S. Appl. No. 15/154,077, filed May 13, 2016 (45 pages).
Busby et al., "Tamper-Proof Electronic Packages With Stressed Glass Component Substrate(s)", U.S. Appl. No. 15/154,088, filed May 13, 2016 (56 pages).
Holm, Ragnar, "Electric Contacts: Theory and Application", Spinger-Verlag, New York, 4th Edition, 1981 (pp. 10-19).
Clark, Andrew J., "Physical Protection of Cryptographic Devices", Advanced in Cyprtology, Eurocrypt '87, Springer, Berlin Heidelberg (1987) (11 pages).
Halperin et al., "Latent Open Testing of Electronic Packaging", MCMC-194, IEEE (1994) (pp. 83-33).
Jhang et al., "Nonlinear Ultrasonic Techniques for Non-Destructive Assessment of Micro Damage in Material: A Review", International Journal of Prec. Eng. & Manuf., vol. 10, No. 1, Jan. 2009 (pp. 123-135).
Isaacs et al., "Tamper Proof, Tamper Evident Encryption Technology", Pan Pacific Symposium SMTA Proceedings (2013) (9 pages).
Zhou et al., "Nonlinear Analysis for Hardware Trojan Detection", ICSPCC2015, IEEE (2015) (4 pages).
Isaacs et al., Extended European Search Report for EP 161569892, dated Jul. 8, 2016 (7 pages).
Brodsky et aL, "Circuit Layouts of Tamper-Respondent Sensors", U.S. Appl. No. 15/187,002, filed Jun. 20, 2016 (110 pages).
Brodsky et al., "Tamper-Respondent Assemblies with Enclosure-to-Board Protection", U.S. Appl. No. 15/193,525, filed Jun. 27, 2016 (54 pages).
Fisher et al., "Applying Pressure to Adhesive Using CTE Mismatch Between Components", U.S. Appl. No. 15/193,556, filed Jun. 27, 2016 (71 pages).
Busby et al., "Tamper-Respondent Assembly with Nonlinearity Monitoring", U.S. Appl. No. 15/194,738, filed Jun. 28, 2016 (48 pages).
Dangler et al., "Tamper-Respondent Sensors with Formed Flexible Layer(s)", U.S. Appl. No. 15/249,663, filed Aug. 29, 2016 (109 pages).
Brodsky et al., "Overlapping, Discrete Tamper-Respondent Sensors", U.S. Appl. No. 15/249,671, filed Aug. 29, 2016 (109 pages).
Dangler et al., "Tamper-Respondent Assemblies with Region(s) of Increased Susceptibility to Damage", U.S Appl. No. 15/249,676, filed Aug. 29, 2016 (110 pages).
Brodsky et al., Notice of Allowance for U.S. Appl. No. 14/974,036, filed Dec. 18, 2015, dated Jun. 3, 2016 (18 pages).
Fisher et al., Office Action for U.S. Appl. No. 14/865,686, filed Sep. 25, 2015, dated Jun. 29, 2016 (17 pages).
Fisher et al., Notice of Allowance for U.S. Appl. No. 14/963,681, filed Dec. 9, 2015, dated Jul. 5, 2016 (7 pages).
Brodsky et al., Office Action for U.S. Appl. No. 14/865,651, filed Sep. 25, 2015, dated Jul. 13, 2016 (10 pages).
Isaacs et al., "Replacement List of IBM Patents or Patent Applications Treated As Related" for U.S. Appl. No. 14/637,501, filed Mar. 4 2015, dated Aug. 31, 2016 (2 pages).

\* cited by examiner

ELECTRONIC PACKAGE WITH HEAT TRANSFER ELEMENT(S)

BACKGROUND

In one or more implementations, an electronic package may be configured as a tamper-proof electronic package. Many activities require secure electronic communications. To facilitate secure electronic communications, an encryption/decryption system may be implemented on an electronic assembly or printed circuit board assembly that is included in equipment connected to a communications network. Such an electronic assembly is an enticing target for malefactors since it may contain codes or keys to decrypt intercepted messages, or to encode fraudulent messages. To prevent this, an electronic assembly may be mounted in an enclosure, which is then wrapped in a security mesh, and impregnated with polyurethane resin. A security mesh may be, in one or more embodiments, a web or sheet of insulating material with circuit elements, such as closely-spaced, conductive lines fabricated on it. The circuit elements are disrupted if the mesh is torn, and the mesh can be sensed in order to generate an alarm signal. The alarm signal may be conveyed to a monitor circuit in order to reveal an attack on the integrity of the assembly. The alarm signal may also trigger an erasure of encryption/decryption keys stored within the electronic assembly.

In the above configuration, the electronic package, or tamper-proof electronic package, represents one example of a sealed enclosure containing electronic components. As power dissipation of electronic components continues to increase in order to increase performance, cooling becomes more of a challenge at both the component level, as well as the system/assembly level.

BRIEF SUMMARY

Provided herein, in one or more aspects, is an electronic package which includes: a plurality of electronic components; an enclosure in which the plurality of electronic components reside, the enclosure comprising a thermally conductive cover overlying the plurality of electronic components; at least one heat transfer element coupled to, or integrated with, the thermally conductive cover of the enclosure and residing between the thermally conductive cover of the enclosure and at least one electronic component of the plurality of electronic components, the thermal heat transfer element(s) being thermally conductive and spaced from the at least one electronic component; and a thermal interface material disposed between and coupling the at least one heat transfer element and the at least one electronic component, and facilitating conductive transfer of heat from the at least one electronic component to the thermally conductive cover of the enclosure through the at least one heat transfer element, the thermally conductive cover facilitating spreading and dissipating the transferred heat outwards.

In another aspect, an electronic package is provided which includes: a substrate supporting a plurality of electronic components; an enclosure in which the substrate supporting the plurality of electronic components resides, the enclosure being sealed and comprising a thermally conductive cover overlying the plurality of electronic components; at least one heat transfer element coupled to, or integrated with, the thermally conductive cover of the enclosure and residing between the thermally conductive cover of the enclosure and at least one electronic component of the plurality of electronic components, the at least one heat transfer element being thermally conductive and spaced from the at least one electronic component; and a thermal interface material disposed between and coupling the at least one heat transfer element and the at least one electronic component, and facilitating conductive transfer of heat from the at least one electronic component to the thermally conductive cover of the enclosure through the at least one heat transfer element, the thermally conductive cover facilitating spreading and dissipating of the transferred heat outwards through the tamper-respondent sensor.

In a further aspect, a method is provided which includes fabricating an electronic package. The fabricating includes, for instance: providing a substrate supporting a plurality of electronic components; providing an enclosure in which the substrate with the plurality of electronic components resides, the enclosure comprising a thermally conductive cover overlying the plurality of electronic components; providing at least one heat transfer element coupled to, or integrated with, the thermally conductive cover of the enclosure and residing between a main surface of the thermally conductive cover of the enclosure and at least one electronic component of the plurality of electronic components, the at least one heat transfer element being thermally conductive and spaced from the at least one electronic component; and applying a thermal interface material between a main surface of the at least one heat transfer element and the at least one electronic component to couple together to the at least one heat transfer element and the at least one electronic component, and thereby facilitate conductive transfer of heat from the at least one electronic component to the thermally conductive cover of the enclosure through the at least one heat transfer element, the thermally conductive cover facilitating spreading and dissipating of the transferred heat outwards.

Additional features and advantages are also realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
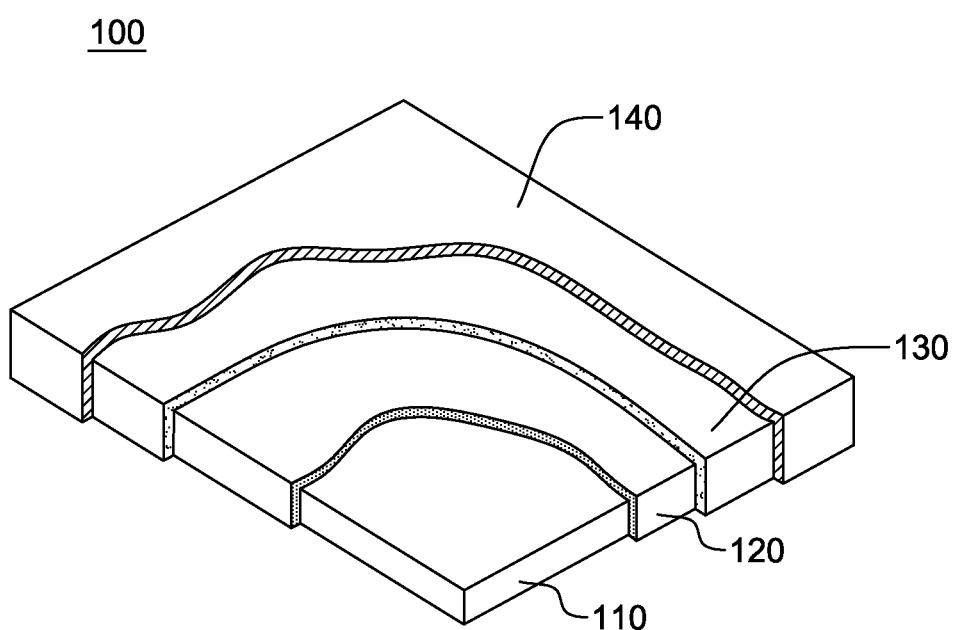
FIG. 1 is a partial cut-away of one embodiment of an electronic package to include enhanced heat transfer capabilities, in accordance with one or more aspects of the present invention.

Reference is first made to FIG. 1 of the drawings, which illustrates one embodiment of an electronic package 100, which may include enhanced heat transfer capabilities, in accordance with one or more aspects of the present invention. By way of example, electronic package 100 is configured as a tamper-proof electronic package for purposes of discussion. Those skilled in the art will note from the following description, however, that the heat transfer facilities disclosed herein are applicable to a variety of electronic package configurations, and particularly to configurations where the surrounding enclosure is sealed, presenting a challenge to cooling components within the enclosure.

In the depicted embodiment, an enclosure 110 is provided containing, for instance, an electronic assembly, which in one embodiment may include a plurality of electronic components, such as an encryption module and associated memory. The encryption module may comprise security-sensitive information with, for instance, access to the information stored in the module requiring use of a variable key, and with the nature of the key being stored in the associated memory within the enclosure.

In one or more implementations, a tamper-proof electronic package such as depicted is configured or arranged to detect attempts to tamper-with or penetrate into enclosure 110. Accordingly, enclosure 110 also includes, for instance, a monitor circuit which, if tampering is detected, activates an erase circuit to erase information stored within the associated memory, as well as the encryption module within the communications card. These components may be mounted on, and interconnected by, a printed circuit board or other substrate, and be internally powered via a power supply provided within the enclosure.

In the embodiment illustrated, and as one example only, enclosure 110 is surrounded by a tamper-respondent sensor 120, an encapsulant 130, and an outer, thermally conductive enclosure 140. In one or more implementations, tamper-respondent sensor 120 may comprise a folded, tamper-respondent laminate, and encapsulant 130 may be provided in the form of a molding. Tamper-respondent sensor 120 may include various detection layers, which are monitored via a ribbon cable (discussed below) by the enclosure monitor, against sudden violent attempts to penetrate enclosure 110 and damage the enclosure monitor or erase circuit before information can be erased from the encryption module. The tamper-respondent sensor may be, for example, any such article commercially available or described in various publications and issued patents.

By way of example, tamper-respondent sensor 120 may be formed as a tamper-respondent laminate comprising a number of separate layers with, for instance, an outermost lamination-respondent layer including a matrix of diagonally-extending, semi-conductive lines printed onto a regular, thin insulating film. The matrix of lines forms a number of continuous conductors which would be broken if attempts are made to penetrate the film. The lines may be formed, for instance, by printing carbon-loaded polyester ink onto the film, and selectively connecting the lines on each side, at the edges of the film. Connections between the lines and an enclosure monitor of the communications card may be provided via, for instance, one or more ribbon cables. The ribbon cable itself may be formed of lines of carbon-loaded ink printed onto an extension of the film, if desired. Connections between the matrix and the ribbon cable may be made via connectors formed on one edge of the film. As noted, the laminate may be folded to define the tamper-respondent sensor 120 surrounding enclosure 110.

By way of further explanation, the laminate may also include a laser and pierce-respondent layer, which may include tracks of carbon-loaded polyester ink printed onto opposite sides of an electrically insulating film. The tracks on opposite sides of the film may be of the same pattern, but offset to lie directly below spaces between the tracks in the opposite surface. The tracks may be of a width and pitch that such piercing of the film at any point results in damage to at least one of the tracks. The tracks may be connected in series to define one or more conductors, and be electrically connected to the enclosure monitor associated with the electronic assembly. The enclosure monitor monitors resistance to the lines, and detection of an increase in resistance, caused my cutting of one or more of the tracks, will cause information stored in the encryption module to be erased. Providing the track in a saw-tooth pattern makes it more difficult to cut the film without detection, as a slot of any length cut in the film is ensured to intersect with one of the tracks.

The various elements of the laminate may be adhered together and folded around enclosure 110, in a similar manner to gift-wrapping a parcel, to define the tamper-respondent sensor 120. The assembly may be placed in a mold which is then filled with, for instance, cold-pour polyurethane, and the polyurethane may be cured and hardened to form encapsulant 130. The encapsulant may, in one or more embodiments, completely surround the tamper-respondent sensor 120 and enclosure 110, and thus form a complete environmental seal, protecting the interior of the enclosure. The hardened polyurethane is resilient and increases robustness of the electronic package in normal use. Outer, thermally conductive enclosure 140 may optionally be provided over encapsulant 130 to, for instance, provide further structural rigidity to the electronic package.

Within the context of a sealed electronic package, such as the tamper-proof electronic package depicted in FIG. 1 and described above, structures and methods for facilitating heat transfer from one or more electronic components disposed therein outwards through the enclosure and any other layers of the electronic package are provided. Prior to describing the enhanced heat transfer facilities, however, a conventional tamper-proof electronic package is described in greater detail below.

Figure 2:
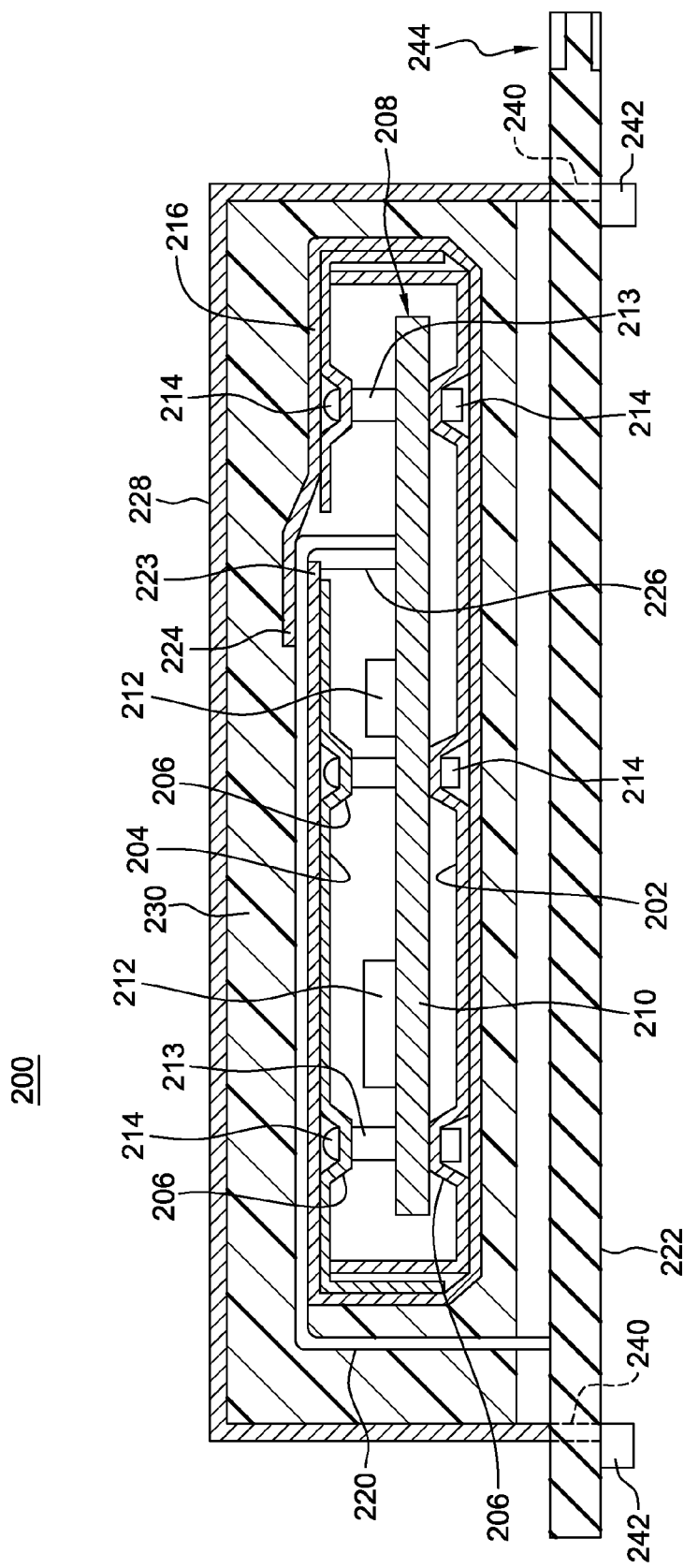
FIG. 2 is a cross-sectional elevational view of one embodiment of a prior art, tamper-proof electronic package comprising an electronic assembly.

FIG. 2 depicts in detail one embodiment of a tamper-proof electronic package 200. Electronic package 200 is defined by, for instance, a base metal shell 202 and a top metal shell 204. Outer surfaces of base metal shell 202 and top metal shell 204 may be provided with dimples 206, with an electronic assembly 208 resting on dimples 206 defined in base metal shell 202. Electronic assembly 208 may include, for instance, a printed circuit board 210 with electronic components 212 that are electrically connected via conductors (not shown) defined within or on printed circuit board 210.

Hollow spacers 213 may be placed below dimples 206 in top metal shell 204, and rivets 214 provided, extending through openings in dimples 206, through hollow spacers 213 and through openings in printed circuit board 210 to base metal shell 202 in order to fixedly secure electronic assembly 208 within the enclosure formed by base and top metal shells 202, 204. A security mesh or tamper-respondent sensor 216 is wrapped around the top, base, and four sides of the enclosure formed by base and top metal shells 202, 204. As illustrated, in one or more embodiments, top metal shell 204 may have an opening through which a bus 220 extends. One end of bus 220 may be connected to conductors (not shown) on printed circuit board 210, and the other end may be connected to conductors (not shown) on a printed circuit board 222. As bus 220 passes through the opening, the bus extends between an inner edge region 223 of the security mesh 216 and an overlapping, outer edge region 224 of the security mesh 216. A group of wires 226 connect, in one embodiment, security mesh 216 to conductors on printed circuit board 210. Circuitry on printed circuit board 210 is responsive to a break in security mesh 216, in which case, an alarm signal may be emitted on bus 220, and also encryption/decryption keys stored within electronic assembly 208 may be erased.

In one or more implementations, liquid polyurethane resin may be applied to security mesh 216 and cured. An outer, thermally conductive enclosure 228, such as a copper enclosure, may be filled with liquid polyurethane resin with the electronic assembly and inner enclosure and security mesh suspended within it. Upon curing the resin, the electronic assembly and inner enclosure and security mesh become embedded in a polyurethane block or encapsulant 230, as shown. The enclosure 228 is mounted on the printed circuit board 222, which can be accomplished using, for instance, legs 240 which extend through slots in printed circuit board 222 and terminate in flanges 242, which are then bent out of alignment with the slots. Bus 220 may be connected, by way of printed circuit board 222 to connectors 244 located along, for instance, one edge of printed circuit board 222.

Due in part to the presence of encapsulant 230, it has been discovered that temperature of one or more electronic components 212 within the inner enclosure defined, for instance, by base metal sheet 202 and top metal sheet 204, may become undesirably high, particularly for next-generation electronic packages. Should temperature within the inner enclosure become excessive, performance of one or more of the components, including, for instance, the encryption module, may be negatively impacted or even degraded. Next-generation electronic packaging thus requires improved thermal performance to meet ever increasing electronic performance demands.

In addition, when considering tamper-proof packaging, the electronic package will need to maintain defined tamper-proof requirements, such as those set forth in the National Institutes of Standards and Technology (NIST) Publication 140-2, which is a U.S. Government Computer Security Standard, used to accredit cryptographic modules. The NIST 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs). Security Level 4 cryptographic modules are useful for operation in physically unprotected environments. Security Level 4 also protects a cryptographic module against a security compromise due to environmental conditions or fluctuations outside of the module's normal operating ranges for voltages and temperature. Intentional excursions beyond the normal operating ranges may be used by an attacker to thwart the cryptographic module's defenses. The cryptographic module is required to either include specialized environmental protection features designed to detect fluctuations and zeroize critical security parameters, or to undergo rigorous environmental failure testing to provide reasonable assurance that the module will not be affected by fluctuations outside of the normal operating range in a manner that can compromise the security of the module.

Additionally, in one or more implementations, the thermal enhancements to the tamper-proof electronic package need to work with defined size limitations for existing packages. For instance, a thermally enhanced electronic package may need to work with peripheral component interconnect express (PCIe) size limits, and the limitations resulting from being encapsulated in, for example, an insulating encapsulant.

Generally stated, disclosed herein therefore are electronic packages, which include, for instance, a plurality of electronic components, and an enclosure in which the plurality of electronic components reside. The substrate and electronic components may comprise, by way of example only, an electronic assembly, such as the above-described electronic assembly of a tamper-proof electronic package. By way of example, the enclosure may be a thermally conductive enclosure comprising a thermally conductive cover overlying the plurality of electronic components, and a thermally conductive base, for instance, disposed below a substrate supporting the electronic components. One or more heat transfer elements are coupled to, or integrated with, the thermally conductive cover of the enclosure and reside between a main surface of the thermally conductive cover and one or more electronic components of the plurality of electronic components within the enclosure. The heat transfer element(s) comprises, in one or more implementations, a thermally conductive material, such as a metal, for instance, copper, brass, aluminum, gold, a metal alloy, or potentially a more exotic thermally conductive material, such as diamond, graphite, graphene, beryllium oxide, etc. The heat transfer elements(s) is spaced from the respective electronic component(s), and a thermal interface material (TIM) is disposed between and couples the heat transfer element(s) and the respective electronic component(s) to facilitate conductive transfer of heat from the electronic component(s) to the thermally conductive cover of the enclosure through the heat transfer element(s). The thermally conductive cover then facilitates spreading and dissipating of the transferred heat outwards.

By way of example, the enclosure may be surrounded by a tamper-respondent sensor, and the tamper-respondent sensor may be surrounded by an encapsulant. The heat transfer element(s) and the thermally conductive cover facilitate conduction of heat from the electronic component(s) out to the cover, and thus dissipating of the heat outwards through the tamper-respondent sensor and the surrounding encapsulant.

In one or more implementations, the one or more heat transfer elements may be sized in one or more dimensions to the associated electronic components to be cooled. By so sizing the heat transfer element(s), the heat transfer element(s) may be aligned directly over the associated electronic component(s) of the plurality of electronic components. This ensures, for instance, that the heat transfer element(s) will not contact or otherwise interfere with one or more other electronic components of the plurality of electronic components supported by the substrate.

By way of example, the heat transfer element may be formed integral with the thermally conductive cover, and extend towards the electronic component(s) from the main surface of the thermally conductive cover. Alternatively, the heat transfer element(s) may be a separate element or block physically coupled to and contacting the main surface of the thermally conductive cover of the enclosure so as to extend from the main surface of the enclosure towards the associated electronic component(s). In one or more embodiments, the thermally conductive cover may be formed of similar or different thermally conductive material from the heat transfer element(s).

In certain embodiments, multiple heat transfer elements may be coupled to, or integrated with, the thermally conductive cover of the enclosure, and reside between the main surface of the thermally conductive cover and multiple electronic components of the plurality of electronic components. Further, a heat transfer element of the multiple heat transfer elements may overlie two or more electronic components of the multiple electronic components, and be coupled thereto via the thermal interface material. In one or more other implementations, the multiple electronic components may include two or more differently sized electronic components, and the multiple heat transfer elements may include two or more differently sized heat transfer elements, respectively sized to, and aligned over, an associated one of the differently sized electronic components, and coupled thereto via the thermal interface material. By way of example, sizing the of a heat transfer element to an electronic component may include sizing the area of a main conduction surface of the element to an area of the upper surface of the electronic component to which the heat transfer element couples, via the thermal interface material.

In certain embodiments, at least one other electronic component of the plurality of electronic components may be directly coupled to the main surface of the thermally conductive cover of the enclosure via the thermal interface material. The thermally conductive cover may be spaced in close proximity to, at a specified height over, the at least one other electronic component to facilitate direct coupling of the other electronic component(s) to the main surface of the thermally conductive cover via a thin layer of the thermal interface material. For instance, multiple spacers or standoffs may be provided within the enclosure to define the distance between the inner surface of the thermally conductive cover and the base of the enclosure. The multiple spacers may extend through respective openings in the substrate, contacting the base of the enclosure, and thus setting the height of the thermally conductive cover over the plurality of electronic components. In one or more examples, the thermally conductive cover may have a thickness, and/or the multiple spacers may be sized, to bring the main surface of the thermally conductive cover in close proximity to the one or more other electronic components. For instance, close proximity might be in the range of 0.1 to 0.5 mm.

In one or more implementations, the size and configurations of the electronic components may vary, such that the components may extend to different heights above the substrate, and thus, different distances may exist between the components and the main surface of the thermally conductive cover. In such cases, the thickness of the heat transfer elements may vary, dependent on the specified spacing between the respective electronic components and the thermally conductive cover.

In one or more specific implementations, the thermally conductive cover may include one or more recessed regions, for instance, to accommodate one or more higher electronic components or cabling to the components or substrate. Within such a region, one or more heat transfer elements, such as described herein, may be employed to facilitate thermal conduction of heat from the one or more electronic components to the thermally conductive cover within the recessed region.

Figure 3A:
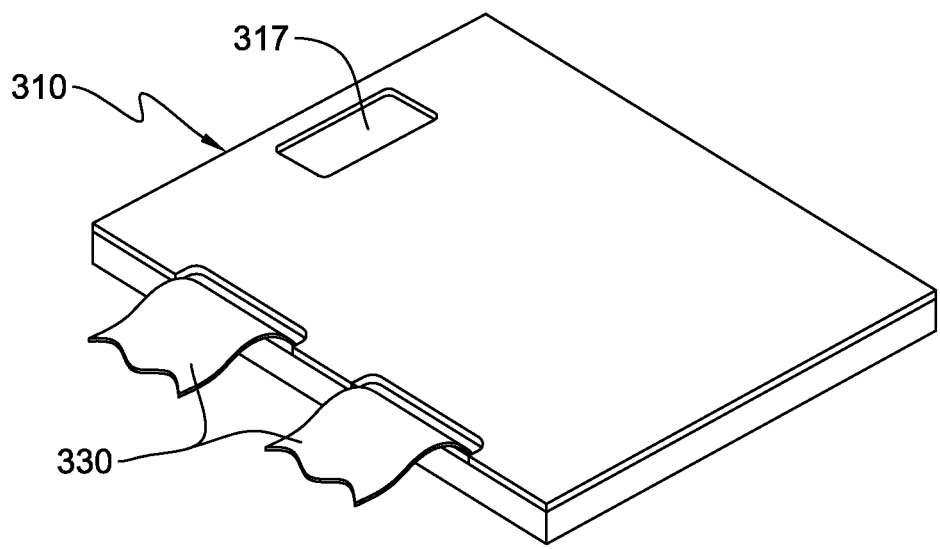
FIG. 3A depicts one embodiment of an electronic package, in accordance with one or more aspects of the present invention.
Figure 3C:
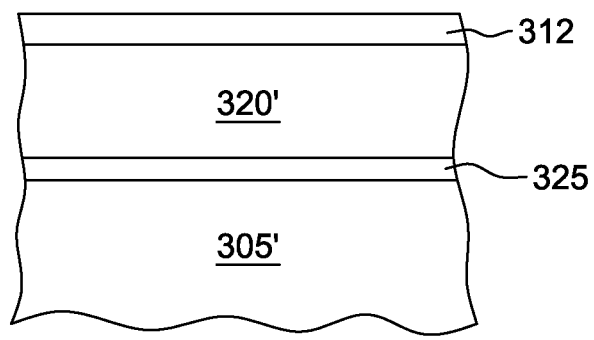
FIG. 3C is a partial cross-sectional, assembled elevational view of the thermally conductive cover and an electronic component of FIG. 3B, with a respective heat transfer element shown extending from the cover and to the electronic component via a thermal interface material, in accordance with one or more aspects of the present invention.
Figure 3B:
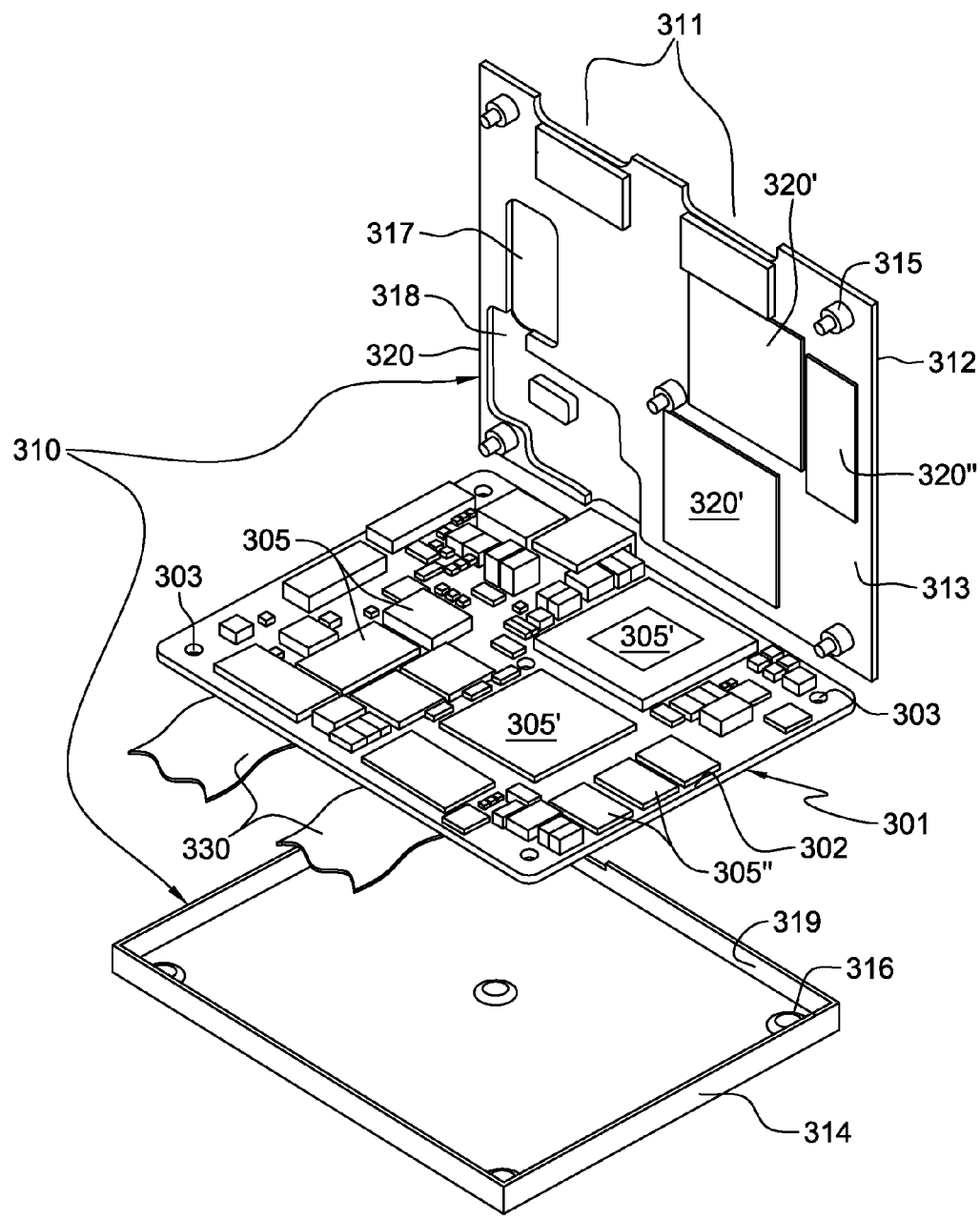
FIG. 3B depicts the electronic package of FIG. 3A, with the thermally conductive cover and the base of the enclosure shown exploded from electronic components housed within the enclosure, in accordance with one or more aspects of the present invention.

Referring collectively to FIGS. 3A-3C, one detailed embodiment of an electronic package 300 is illustrated, by way of example. Electronic package 300 includes, in one or more embodiments, an enclosure 310 comprising an electronic system 301, such as an electronic assembly of a tamper-proof electronic package. However, note that this is indicated as one example only. The inventive concepts disclosed herein are applicable to other types of electronic packages, and to other electronic systems as well.

In the embodiment illustrated, electronic system 301 includes a substrate 302, such as a printed circuit board, and a plurality of heat-dissipating components, such as a plurality of electronic components 305, 305', 305", with one or more electronic components 305', 305" of the plurality of electronic components being higher heat-flux -producing components, such as, for instance, processor modules 305' and supporting memory modules 305".

In the depicted embodiment, enclosure 310 includes a thermally conductive cover 312 overlying electronic system 301, and a base 314, such as a thermally conductive base, disposed beneath electronic system 301. A plurality of spacers or standoffs 315 are provided extending, for instance, through respective openings 303 in substrate 302 and engaging respective recesses 316 in base 314. The plurality of spacers 315 define a spacing between thermally conductive cover 312 and base 314, and also set the height of the inner main surface 313 of thermally conductive cover 312 over, for instance, respective upper surfaces of the electronic components 305, 305', 305", of electronic system 301. This height is set sufficient to accommodate all the differently sized components within the electronic system without the cover physically contacting any of the components to guard against applying undue pressure to the components, potentially damaging the highest component or electrical interconnects to, for instance, substrate 302.

In the embodiment depicted, thermally conductive cover 312 includes recessed edge regions 311 along an edge thereof, and an opening 317. Note that recessed edge regions 311 and opening 317 are for one embodiment only of enclosure 310, being provided, for instance, for a tamper-proof electronic package, where enclosure 310 is to be surrounded by, in part, an encapsulant such that an airtight or sealed compartment is defined within electronic package 300, and more particularly, within enclosure 310. By way of example, recessed edge regions 311 may be provided to accommodate flexible ribbon cables 330, which may, for instance, electrically interconnect a tamper-respondent sensor (not shown) surrounding enclosure 310 to monitor circuitry within electronic system 301. Opening 317 may be provided to facilitate, for instance, electrical interconnection to one or more components or connectors associated with electronic system 301, with the opening being subsequently sealed about the cabling to provide, in one embodiment, an airtight enclosure about electronic system 301. In addition, note that in one or more embodiments, thermally conductive cover 312 may include one or more recessed regions 318 in inner main surface 313 thereof, configured and sized to accommodate, for instance, one or more cables (not shown) electrically connecting to one or more components of electronic system 301.

In one or more implementations, thermally conductive cover 312 of enclosure 310 may be formed of copper, brass, or aluminum, or alternatively, gold, diamond, graphite, graphene, beryllium oxide, etc., assuming that the desired high thermal conductivity is provided by the material. In one or more other embodiments, a metal alloy may be employed, or multiple layers of thermally conductive material could be used to define thermally conductive cover 312. Base 314 may comprise, in one or more implementations, a thermally conductive material as well, such as the above-noted materials of thermally conductive cover 312. In addition, base 314 may include sidewalls 319 facilitating defining enclosure 310 about electronic system 301, and more particularly, about the substrate and the plurality of electronic components thereof.

As illustrated, one or more heat transfer elements 320 are provided extending from main surface 313 of thermally conductive cover 312. For instance, heat transfer elements 320 may be coupled to, or integrated with, thermally conductive cover 312 to provide heat conduction pathways from one or more electronic components 305', 305", to thermally conductive cover 312 of enclosure 310, to facilitate heat dissipation from the one or more electronic components, which in one example, may be higher heat-flux-dissipating components within the enclosure. By way of example, relatively large heat transfer elements 320' may be provided, configured to and aligned over the higher heat-dissipating, electronic components 305', with each heat transfer element 320' being sized in one or more dimensions (for instance, in x-y dimensions) to correspond to the upper surface area and configuration of the respective electronic component 305', over which the heat transfer element is disposed, and to which the heat transfer element 320' couples via, for instance, a thermal interface material (TIM), such as a thermal interface pad or material offered by Parker Chomerics of Woburn, Mass., USA, a liquid dispense, thermally conductive material or gap pad, offered by the Bergquist Company, of Chanhassen, Minn., USA, or a phase change material, etc.

As depicted in FIG. 3C, in one or more assembled implementations, each heat transfer element 320, 320', 320" has a thickness or height appropriate for the space between the respective electronic component 305, 305', 305" (for which enhanced cooling is to be provided), and the inner surface 313 of thermally conductive cover 312. For instance, the thickness of each heat transfer element 320, 320', 320", is chosen so as to bring the respective heat transfer element in close proximity to the respective electronic component for which enhanced cooling is to be provided, without directly contacting the electronic component to prevent undue pressure from being applied to the electronic component, potentially damaging the component or its electrical interconnects. Within this space or gap separating the element and component, thermal interface material 325 is provided to couple the structures together and facilitate conductive transfer of heat from the respective electronic component to the thermally conductive cover of the enclosure through the heat transfer element, with the thermally conductive cover facilitating spreading and dissipating of the transferred heat outwards.

In one or more implementations, heat transfer elements 320, 320', 320" are provided sized to the particular electronic component or components, which they are configured to overlie. By way of example, heat transfer element 320" is configured to overlie multiple heat-dissipating components 305" to facilitate conductive transfer of heat from those components in parallel to thermally conductive cover 312. By way of further example, one or more heat transfer elements 320 may reside within recessed region 318 of thermally conductive over 312 and couple to one or more electronic components of the system lying beneath the recessed region 318 via the thermal interface material. As noted, the thickness of heat transfer elements, 320, 320', 320" may vary, depending upon the set spacing between the upper surfaces of the respective electronic components to which the heat transfer elements align, and main surface 313 of thermally conductive cover 312.

Figure 4:
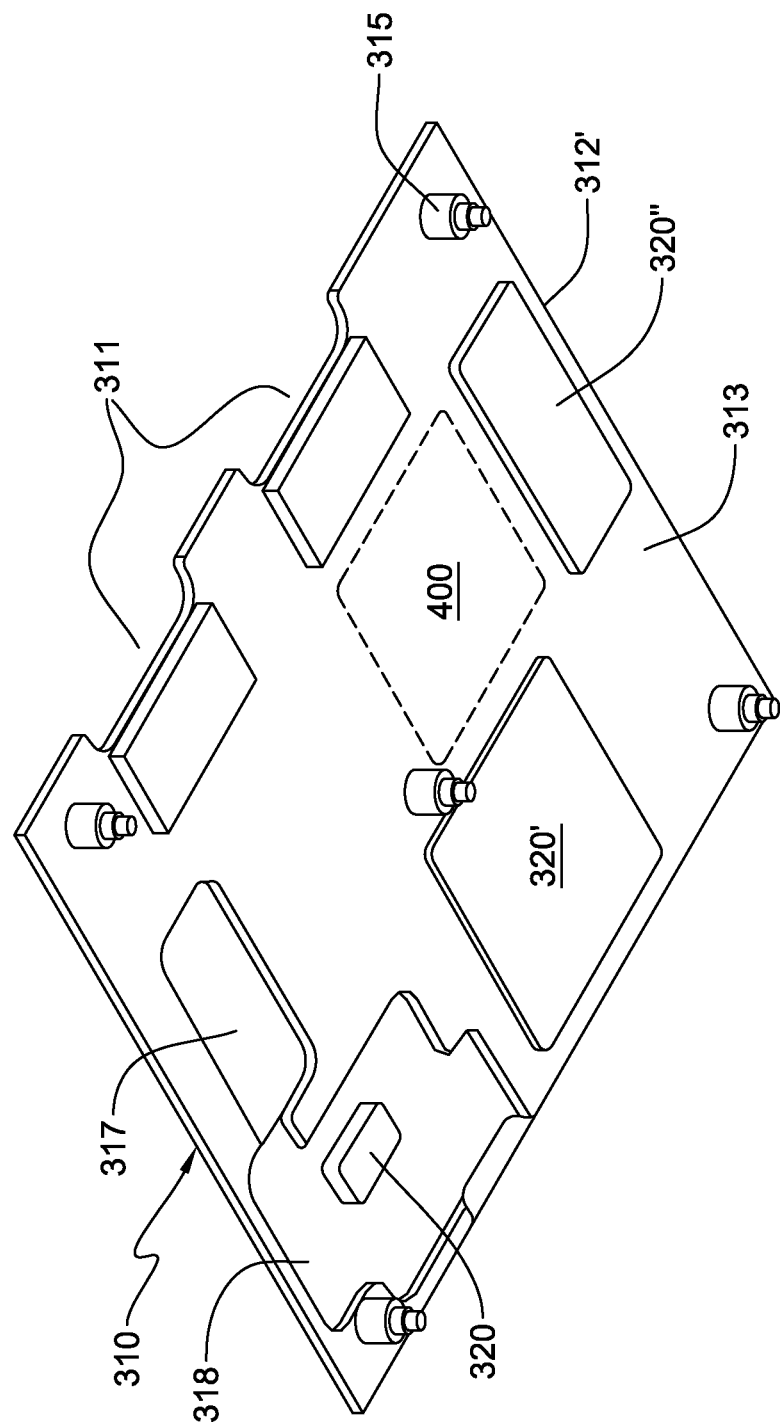
FIG. 4 depicts an alternate embodiment of a thermally conductive cover and heat transfer elements for an enclosure such as depicted in FIGS. 3A-3C, in accordance with one or more aspects of the present invention.

FIG. 4 depicts a variation on a thermally conductive cover 312' of an enclosure such as described above in connection with FIGS. 3A-3C. In this variation, the plurality of spacers or stand-offs 315 are sized, and/or the thickness of the thermally conductive cover 312' is increased, in order to bring inner main surface 313 of thermally conductive cover 312' in close proximity to the upper surface of one or more electronic components within the enclosure to allow for direct conductive coupling of the one or more electronic components to the inner main surface, for instance, in a region 400 thereof, using a thermal interface material. By way of example, the gap between the one or more electronic components and the inner main surface 313 in region 400 of thermally conductive cover 312 may be in the range of 0.1 to 0.5 mm, which allows for a thin film of thermal interface material to directly couple the one or more components to thermally conductive cover 312 in region 400. Note that in the alternative exemplary embodiment of FIG. 4, one or more of the heat transfer elements 320, 320', 320", of the above-described implementation of FIGS. 3A-3C are also present. That is, the direct coupling of one or more electronic components to the inner main surface 313 of thermally conductive cover 312' using a thermal interface material may be combined with the provision of one or more heat transfer elements, such as described herein. As noted, the plurality of electronic components within the enclosure may be differently configured and have different heights relative to, for instance, the supporting substrate, and thus, be disposed at different distances relative to the inner main surface of the thermally conductive cover. The embodiment variation of FIG. 4 may advantageously reduce, in one or more implementations, costs by eliminating need for one or more of the heat transfer elements, while still providing the desired level of thermal conductivity from identified higher heat flux components within the enclosure to the thermally conductive cover of the enclosure, thus facilitating outward transfer of dissipated heat.

Note that, in one or more embodiments of the electronic packages described above in connection with FIGS. 3A-4, the heat transfer elements may be integrated directly with the thermally conductive cover of the enclosure. That is, in one or more embodiments, the heat transfer elements may comprise, for instance, conductive pedestals or lands extending from the inner surface of the thermally conductive cover, with the pedestals being formed, for instance, monolithically with the thermally conductive cover.

Figure 5:
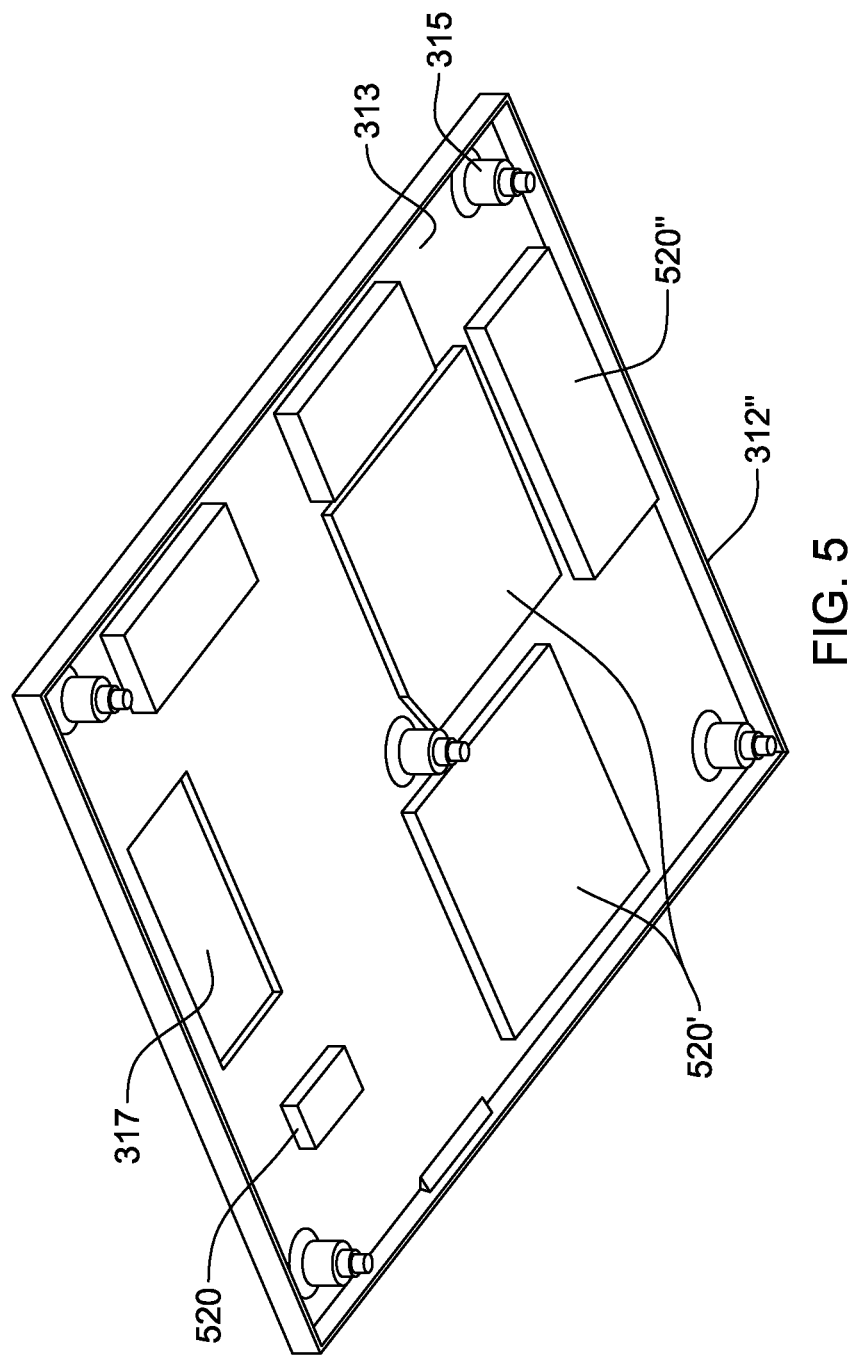
FIG. 5 depicts a further alternate embodiment of a thermally conductive cover and heat transfer elements for an enclosure such as depicted in FIGS. 3A-3C, in accordance with one or more aspects of the present invention.

As depicted in FIG. 5, in one or more alternate embodiments of an electronic package, the heat transfer elements may be formed separately and attached, or coupled to the inner main surface of the thermally conductive cover. By way of example, the heat transfer elements 520, 520', 520", in the embodiment of FIG. 5 may be welded, brazed, or soldered to thermally conductive cover 312". Heat transfer elements 520, 520', 520" may be configured and sized with reference to the respective electronic components to be conductively cooled. By way of example, the heat transfer elements 520, 520', 520", may be similarly configured and disposed as heat transfer elements 320, 320', 320", in the embodiments of FIGS. 3A-3C, with the cover 312 of the embodiment of FIGS. 3A-3C being replaced by the thermally conductive cover 312" of the embodiment of FIG. 5. Direct thermal conductivity to the respective heat transfer elements may be provided using a thermal interface material disposed in the gap established between the heat transfer elements 520, 520', 520", and the respective electronic component to be cooled.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. An electronic package comprising:
a plurality of electronic components;
an enclosure in which the plurality of electronic components reside, the enclosure comprising a thermally conductive cover overlying the plurality of electronic components;
a tamper-respondent assembly fully surrounding the enclosure;
at least one heat transfer element coupled to, or integrated with, a main surface of the thermally conductive cover of the enclosure and residing fully within the enclosure between the main surface of the thermally conductive cover and at least one electronic component of the plurality of electronic components, the at least one heat transfer element being thermally conductive and spaced from the at least one electronic component; and
a thermal interface filler material disposed between and coupling the at least one heat transfer element and the at least one electronic component, and facilitating conductive transfer of heat from the at least one electronic component to the thermally conductive cover of the enclosure through the at least one heat transfer element, the thermally conductive cover facilitating spreading and dissipating the transferred heat outwards through the tamper-respondent assembly.

2. The electronic package of claim 1, wherein the tamper-respondent assembly includes a tamper-respondent sensor, and an encapsulant over the tamper-respondent sensor, the at least one heat transfer element and the thermally conductive cover facilitating dissipating the heat from the at least one electronic component, outwards through the tamper-respondent sensor and the surrounding encapsulant.

3. The electronic package of claim 1, wherein the at least one heat transfer element is sized in multiple dimensions to the at least one electronic component of the plurality of electronic components, and is aligned over the at least one electronic component of the plurality of electronic components.

4. The electronic package of claim 1, wherein the at least one heat transfer element is formed integral with the thermally conductive cover, extending from the thermally conductive cover towards the at least one electronic component from the main surface of the thermally conductive cover, and wherein the at least one heat transfer element and the thermally conductive cover are formed from one or more of copper, brass, aluminum, gold, diamond, graphite, graphene, or beryllium oxide.

5. The electronic package of claim 1, wherein the at least one heat transfer element has a main surface opposite to and physically contacting the main surface of the thermally conductive cover of the enclosure, the at least one heat transfer element extending towards the at least one electronic component from the main surface of the thermally conductive cover, and wherein the at least one heat transfer element is formed from one or more of copper, brass, aluminum, gold, diamond, graphite, graphene, or beryllium oxide.

6. The electronic package of claim 1, further comprising multiple heat transfer elements coupled to, or integrated with, the thermally conductive cover of the enclosure, and residing between the main surface of the thermally conductive cover of the enclosure and multiple electronic components of the plurality of electronic components, the at least one heat transfer element being at least one heat transfer element of the multiple heat transfer elements.

7. The electronic package of claim 6, wherein one heat transfer element of the multiple heat transfer elements overlies at least two electronic components of the multiple electronic components, and is coupled thereto via the thermal interface filler material.

8. The electronic package of claim 6, wherein the multiple electronic components comprise at least two differently sized electronic components, and wherein the multiple heat transfer elements comprise at least two differently sized heat transfer elements, each sized to and aligned over a respective electronic component of the at least two differently sized electronic components.

9. The electronic package of claim 1, wherein at least one other electronic component of the plurality of electronic components is directly coupled to the main surface of the thermally conductive cover of the enclosure using the thermal interface filler material, the thermally conductive cover being spaced a specified height over the at least one other electronic component which facilitates the direct coupling of the at least one other electronic component to the main surface of the thermally conductive cover via the thermal interface filler material.

10. The electronic package of claim 1, wherein the thermally conductive cover includes at least one recessed region, and one heat transfer element of the at least one heat transfer element resides within the at least one recessed region of the thermally conductive cover.

11. The electronic package of claim 1, further comprising multiple spacers, the multiple spacers extending between the thermally conductive cover and a base of the enclosure, and setting a height of the thermally conductive cover over the plurality of electronic components, and a gap between the at least one heat transfer element and the at least one electronic component, the gap being filled, at least in part, by the thermal interface material.

12. An electronic package comprising:
- a substrate supporting a plurality of electronic components;
- an enclosure in which the substrate with the plurality of electronic components resides, the enclosure being sealed and comprising a thermally conductive cover overlying the plurality of electronic components;
- a tamper-respondent assembly fully surrounding the enclosure;
- at least one heat transfer element coupled to, or integrated with, a main surface of the thermally conductive cover of the enclosure and residing fully with the enclosure between the main surface of the thermally conductive cover and at least one electronic component of the plurality of electronic components, the at least one heat transfer element being thermally conductive and spaced from the at least one electronic component; and
- a thermal interface filler material disposed between and coupling the at least one heat transfer element and the at least one electronic component, and facilitating conductive transfer of heat from the at least one electronic component to the thermally conductive cover of the enclosure through the at least one heat transfer element, the thermally conductive cover facilitating spreading and dissipating of the transferred heat outwards through the tamper-respondent assembly.

13. The electronic package of claim 12, wherein the tamper-respondent assembly includes a tamper-respondent sensor, and an encapsulant over the tamper-respondent sensor, the at least one heat transfer element and the thermally conductive cover facilitating dissipating the heat from the at least one electronic component outwards through the tamper-respondent sensor and the surrounding encapsulant.

14. The electronic package of claim 12, wherein the at least one heat transfer element is sized in multiple dimensions to the at least one electronic component of the plurality of electronic components, and is aligned over the at least one electronic component of the plurality of electronic components.

15. The electronic package of claim 12, further comprising multiple heat transfer elements coupled to, or integrated with, the thermally conductive cover of the enclosure, and residing between the main surface of the thermally conductive cover of the enclosure and multiple electronic components of the plurality of electronic components, wherein the at least one heat transfer element is at least one heat transfer element of the multiple heat transfer elements, and one heat transfer element of the multiple heat transfer elements overlies at least two electronic components of the multiple electronic components, being coupled thereto via the thermal interface filler material.

16. The electronic package of claim 12, further comprising multiple heat transfer elements coupled to, or integrated with, the thermally conductive cover of the enclosure, and residing between the main surface of the thermally conductive cover of the enclosure and multiple electronic components of the plurality of electronic components, the at least one heat transfer element being at least one heat transfer element of the multiple heat transfer elements, and wherein the multiple electronic components comprise at least two differently sized electronic components, and the multiple heat transfer elements comprise at least two differently sized heat transfer elements, each sized to and aligned over a respective electronic component of the at least two differently sized electronic components.

17. The electronic package of claim 12, wherein at least one other electronic component of the plurality of electronic components is directly coupled to the main surface of the thermally conductive cover of the enclosure via the thermal interface material, the thermally conductive cover being spaced a specified height over the at least one other electronic component which facilitates the direct coupling of the at least one other electronic component to the main surface of the thermally conductive cover via the thermal interface filler material.

18. The electronic package of claim 12, wherein the thermally conductive cover includes at least one recessed region, and one heat transfer element of the at least one heat transfer element resides within the at least one recessed region of the thermally conductive cover.

* * * * *